United States Patent [19]

Grabbe et al.

[11] Patent Number: 5,131,852
[45] Date of Patent: Jul. 21, 1992

[54] ELECTRICAL SOCKET

[75] Inventors: Dimitry G. Grabbe, Middletown; Iosif Korsunsky, Harrisburg, both of Pa.

[73] Assignee: AMP Incorporated, Harrisburg, Pa.

[21] Appl. No.: 749,064

[22] Filed: Aug. 23, 1991

[51] Int. Cl.[5] .................................................. H01R 9/09
[52] U.S. Cl. ........................................ 439/71; 439/68
[58] Field of Search ............... 439/68, 70, 71, 72, 439/73, 67, 77, 525, 526; 174/52.4

[56] References Cited

U.S. PATENT DOCUMENTS

| | | | |
|---|---|---|---|
| 4,169,642 | 10/1979 | Mouissie | 439/68 |
| 4,783,719 | 11/1988 | Jamison et al. | 361/398 |
| 4,859,189 | 8/1989 | Peterson et al. | 439/66 |
| 4,969,828 | 11/1990 | Bright et al. | 439/68 |
| 5,006,792 | 4/1991 | Malhi et al. | 439/68 |

Primary Examiner—Neil Abrams
Attorney, Agent, or Firm—Allan B. Osborne; Bruce J. Wolstoncroft

[57] ABSTRACT

An electrical socket (10) for leadless electronic devices has been disclosed. The socket (10) includes a film-circuit member (16) having circuits (66) on a dielectric base (64) with inner ends (68) for electrically engaging conductive pads on the electronic device and outer ends (74) for being electrically attached to circuits on a substrate. The film-circuit member (16) rests on a support plate (18) positioned in a cavity (42) in a lower housing (20) and is overlaid by an upper housing (12) having an opening (24) for receiving an electronic device.

27 Claims, 6 Drawing Sheets

ELECTRICAL SOCKET

FIELD OF THE INVENTION

The present invention relates to electrical sockets for interconnecting leadless electronic devices to a substrate.

BACKGROUND OF THE INVENTION

It is known from U.S. Pat. No. 4,969,828 to Bright, et al. to provide a socket having a flexible etched circuitry film positioned across a raised platform and a cover having a biasing plate. An IC chip, bonded to a film and positioned in a carrier can be tested by being placed over the film in the socket and biased there against by the cover.

Whereas the above described socket has many advantageous features, a problem of having a uniformity of force distribution over the mating contact areas exists. That is, the biasing plate provides a uniform force but cannot provide such a force for contact areas which are out of tolerance. Accordingly it is now proposed to provide a socket which has a high degree of uniformity of force distribution under even the most extreme out of tolerance conditions.

SUMMARY OF THE INVENTION

According to the present invention, an electrical socket is provided for electrically interconnecting an electronic device to a substrate. The socket includes a support plate of spring tempered metal positioned in a housing and having spring fingers on which inner ends of the circuits on a film-circuit member are positioned. The circuits further include outer ends for electrical engagement with circuits on a substrate. The inner ends engage conductive pads on the electronic device.

DESCRIPTION OF THE INVENTION

Figure 1:
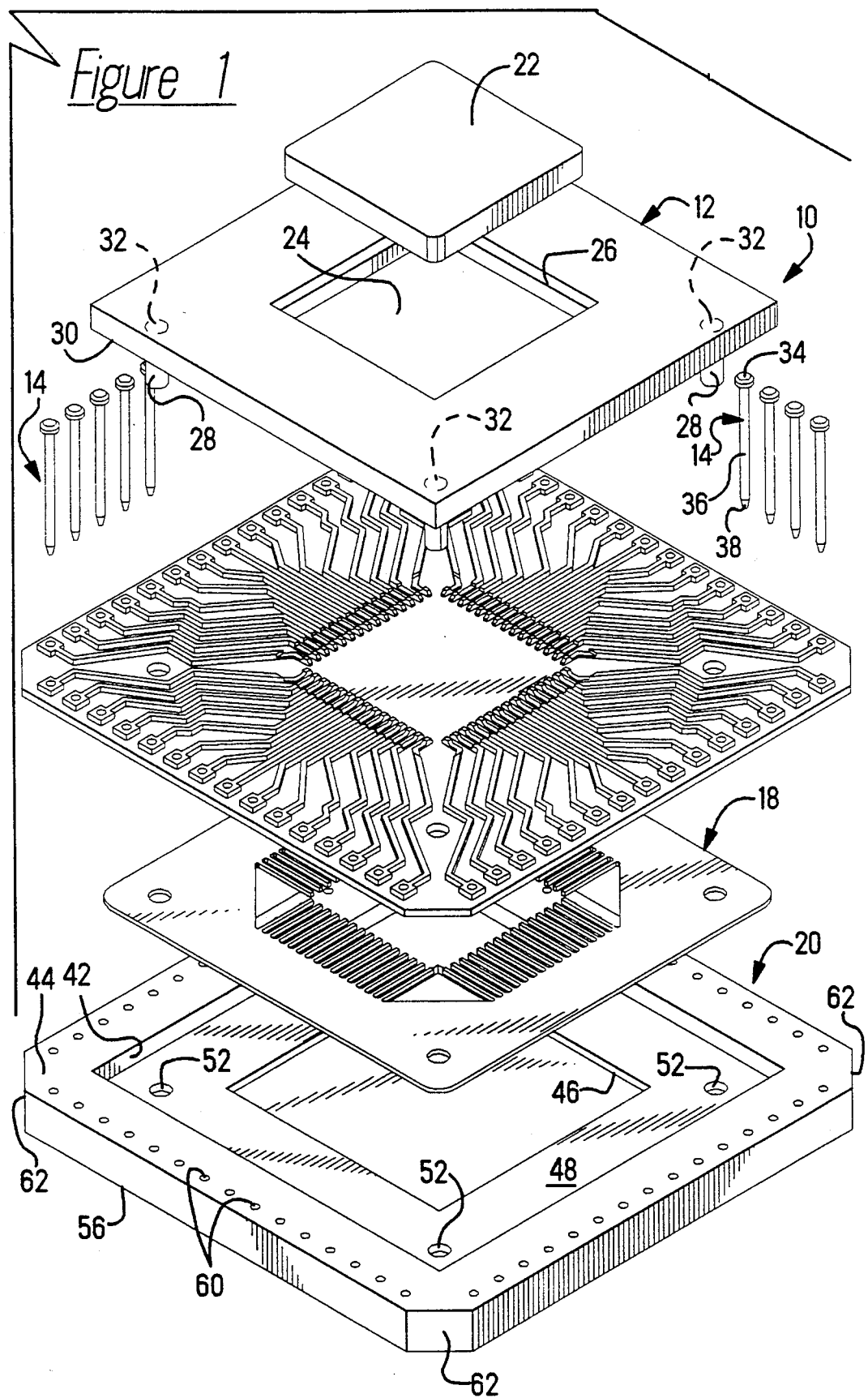
FIG. 1 is an exploded view of a socket having the embodiments of the present invention and a bare IC chip.

With reference to FIG. 1, socket 10 of the present invention is shown with its several components exploded out. These components include upper housing 12, contact elements 14, film-circuit member 16 support plate 18 and lower housing 20. A bare integrated chip 22 is shown above upper housing 12.

Figure 5:
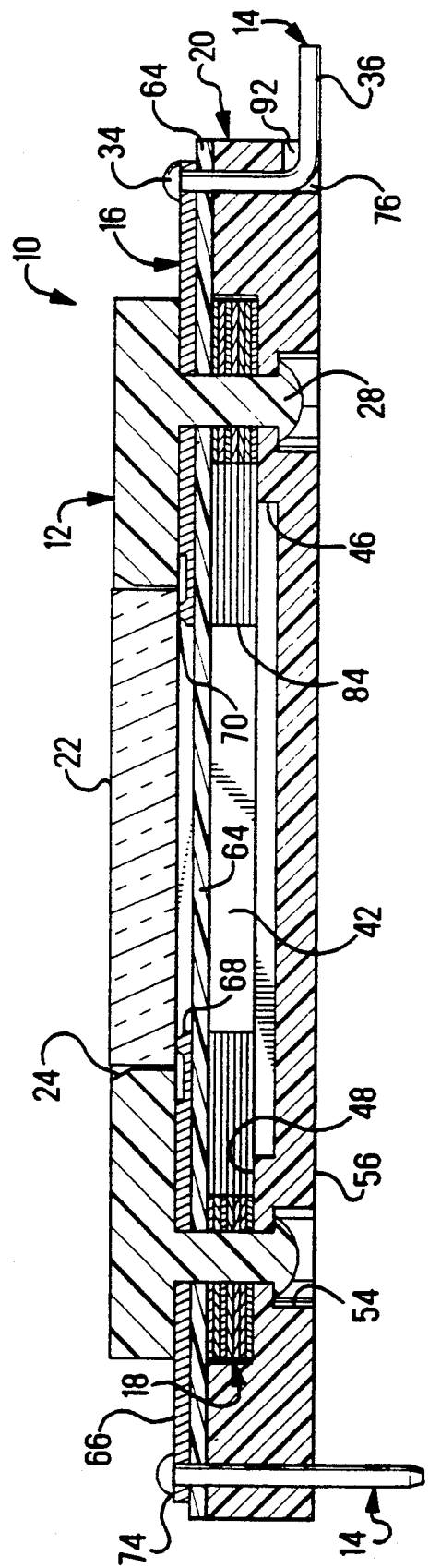
FIG. 5 is a sectioned view of an assembled socket with a chip in place.

Upper housing 12 is a molded part with one suitable molding material being polyphenylene sulfide. However, there are other equally well suited plastics as well as ceramics and metals which can be used. A centrally located opening 24 extends through housing 12 and is provided with a beveled lead-in portion 26. Alignment pegs 28, adjacent each corner, extend outwardly from surface 30. Pegs 28, in the embodiment illustrated, also serve to secure the components together as shown in FIG. 5 as well as providing an alignment function. Alternatively pins 32 (FIG. 6) can also be used in which case holes 33, indicated by the dashed lines would be provided.

Contact elements 14 include head 34 and shelf 36 and are of a suitable conductive material. In the embodiment shown in FIG. 1, elements 14 have a tipped free end 38 which are inserted into holes in test boards (not shown) and soldered. Another embodiment is shown in FIG. 5.

Figure 2:
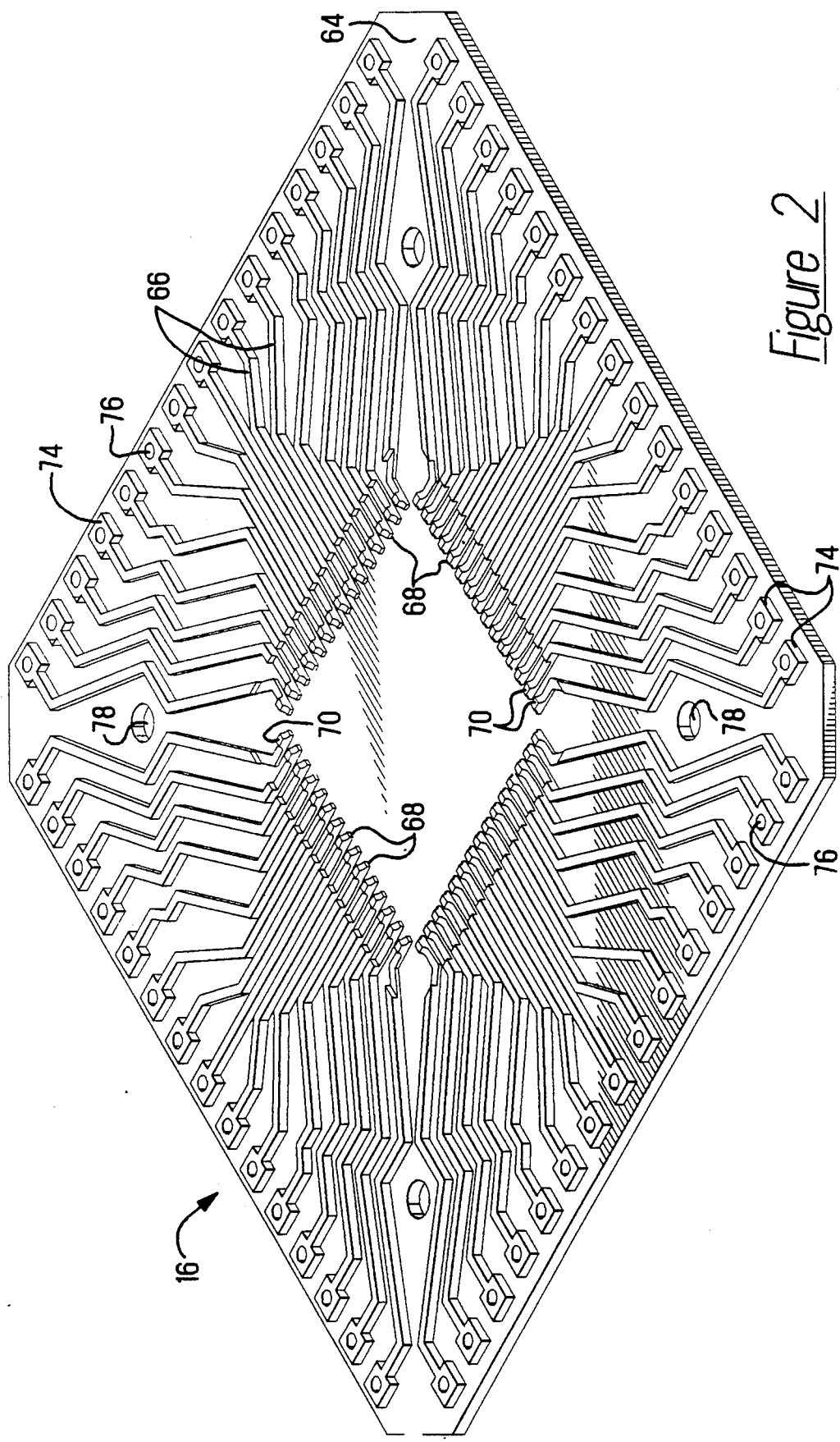
FIG. 2 is a view of a film-circuit member of the socket.
Figure 3:
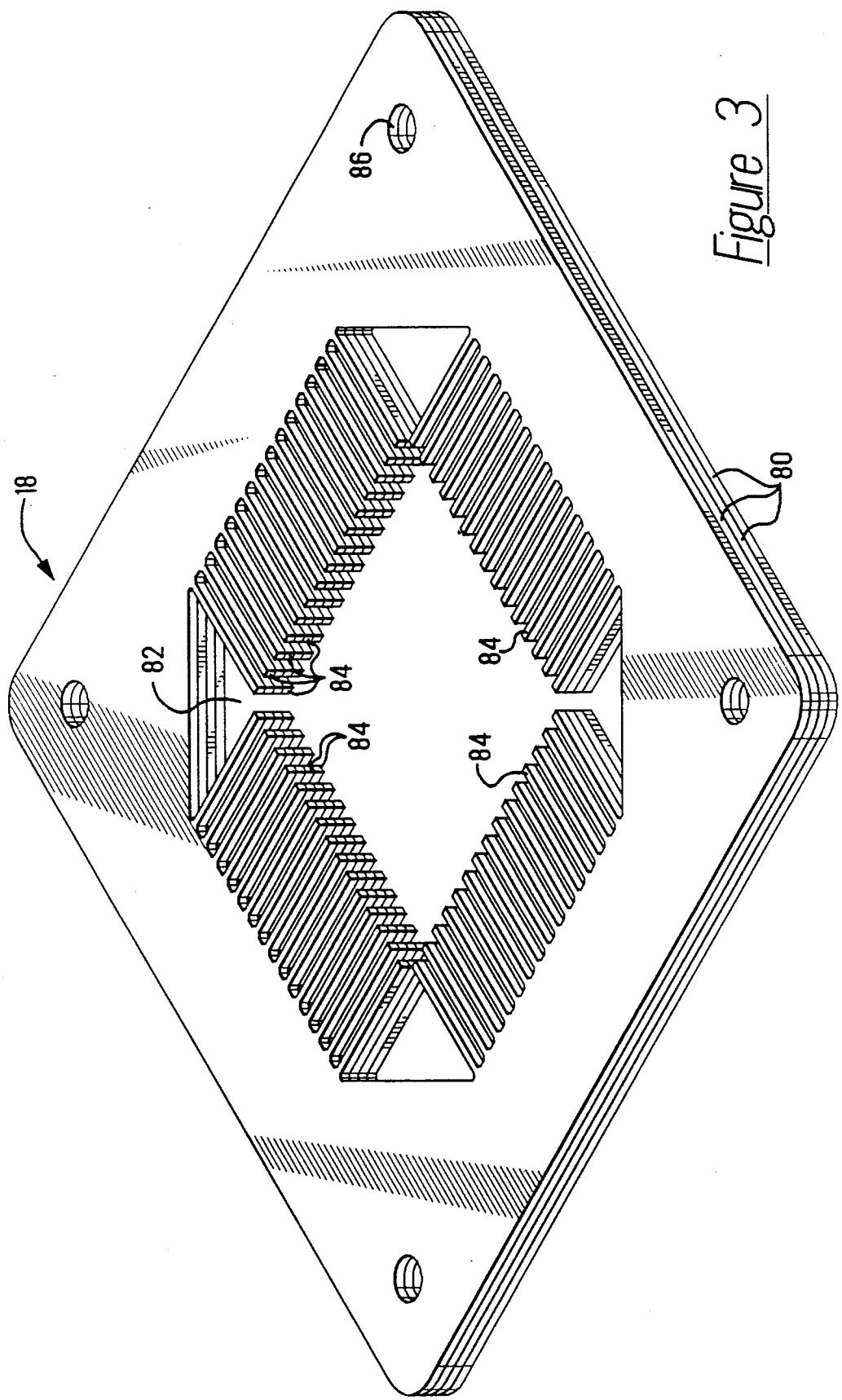
FIG. 3 is a view of a stack of support plates of the socket.

Film member 16 and support plate 18 are described below in conjunction with FIGS. 2 and 3 respectively.

Lower housing 20 is a molded part with the molding material preferably being the same as or compatible with the material of upper housing 12. A first cavity 42 extends into housing 20 from surface 44 and a second cavity 46 or alternative an opening (not shown) of smaller dimensions is provided in floor 48 of the first cavity. Alignment holes 52 adjacent each corner of first cavity 42 extend through housing 20 and may, as shown in the embodiment in FIG. 5, join holes 54 of a larger diameter extending into housing 20 from opposite surface 56.

Contact element holes 60 extend along each side of and through housing 20 to open on opposing surfaces 44,56.

Film-circuit member 16 typically has a Kapton base 64 with conductive traces or circuits 66 on one surface. Each circuit 66 has an inner end 68 which preferably includes a raised contact area 70 which preferably is a gold dot or other noble metals or platings. Areas 70 can be produced by electroforming, wire bonding and breaking off the wires, sometimes followed by laser fusing, or by a number of other, well known processes. Inner ends 68 form a pattern identical to the layout of the bonding pads (not shown) on the chips to be tested.

Figure 4:
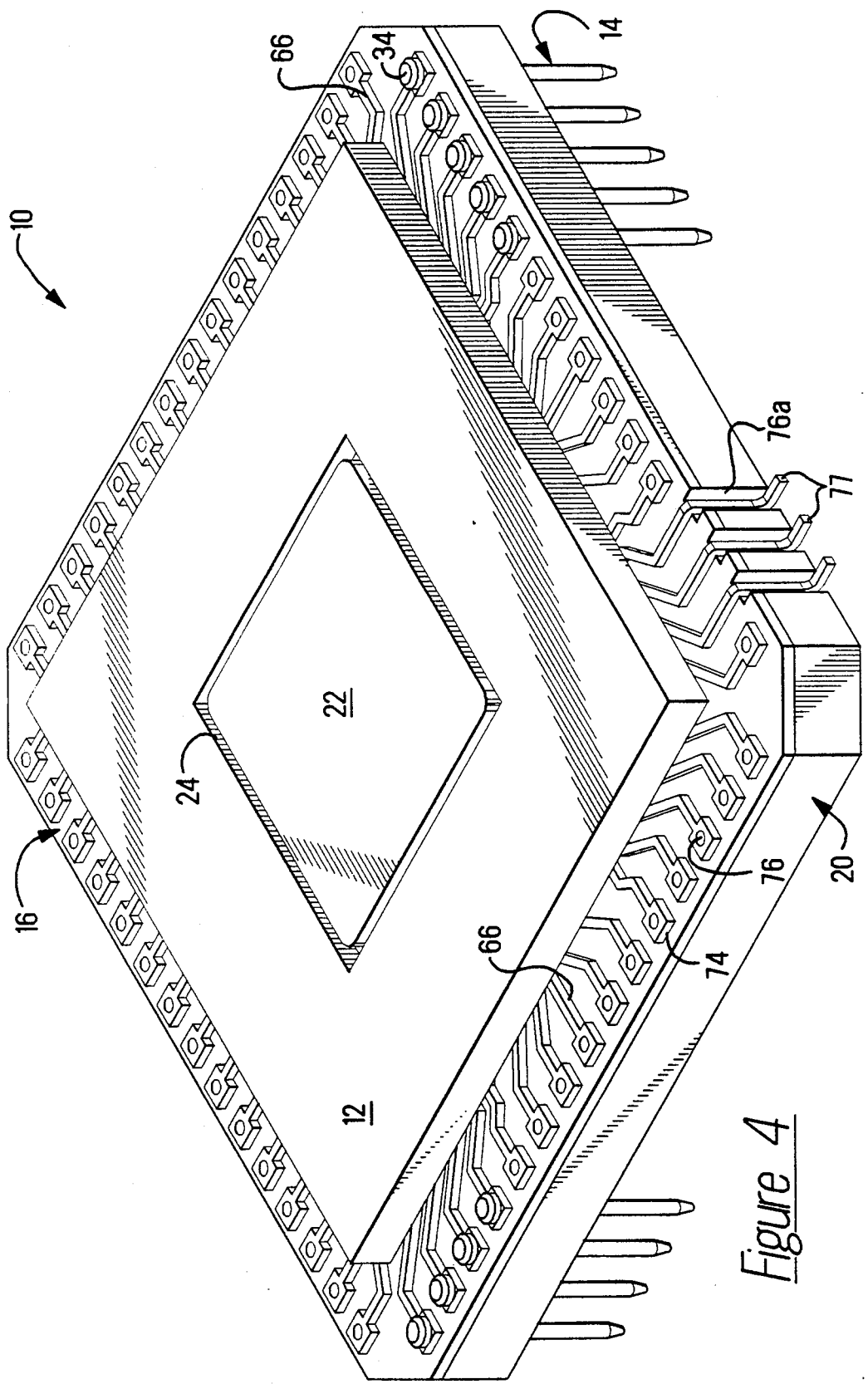
FIG. 4 is a view of an assembled socket with the chip positioned therein.

Each circuit 66 has an outer end pad 74 with holes 76 extending through the pads and through base 64. Alternatively circuits 66 are extended and formed to provide a Gullwing lead 77 as shown in FIG. 4. In this case, holes 76 are replaced by slots 76a.

Four alignment holes 78, located inwardly from each corner, extend through base 64.

Support plate 18 is a stack of thin sheets 80 of spring temper metal which have been contoured by stamping or chemical milling to produce a central opening 82 and spring fingers 84 which project into the opening 82. Fingers 84 are on the same pattern as the inner ends 68 on film-circuit member 16. The number of sheets 80 stacked together determine the amount of stored energy normal force for each bonding pad on the chip. Thus, by selecting the appropriate number of sheets 80, forces from low grams to hundreds of grams can be obtained. The sheets 80 may be bonded together if desired.

Alignment holes 86 are provided through each sheet 80 adjacent the corners thereof.

FIG. 4 shows an assembled socket 10 with chip 22 therein. Note that upper housing 12 is sized so that circuit pads 74 and holes 76 are accessible for the insertion and soldering of contact elements 14.

FIG. 5 shows how socket 10 is assembled. Support plate 18 is placed into lower housing 20 and more particularly in first cavity 42 with spring fingers 84 projecting out over second cavity 46. Film-circuit member 16 is placed on surface 44 and over support plate 18 with the inner ends 68 over respective fingers 84. Upper housing 12 is then added with alignment pegs 28 going through alignment holes 78,86 and 52 in circuit member 16, support plate 18 and lower housing 20 respectively. By upsetting pegs 28 so that it mushrooms out in counterbore 54, the assembly is secured. The assembly can also be secured by pegs 28 or by discrete pins 32 being frictionally received in holes 52. In this case counterbores 54 are not required. Pins 32 would be preferred where housings 12 and 20 are of ceramic or metal.

Contact elements 14 are then inserted through holes 76 and heads 34 soldered to pads 74.

Figure 6:
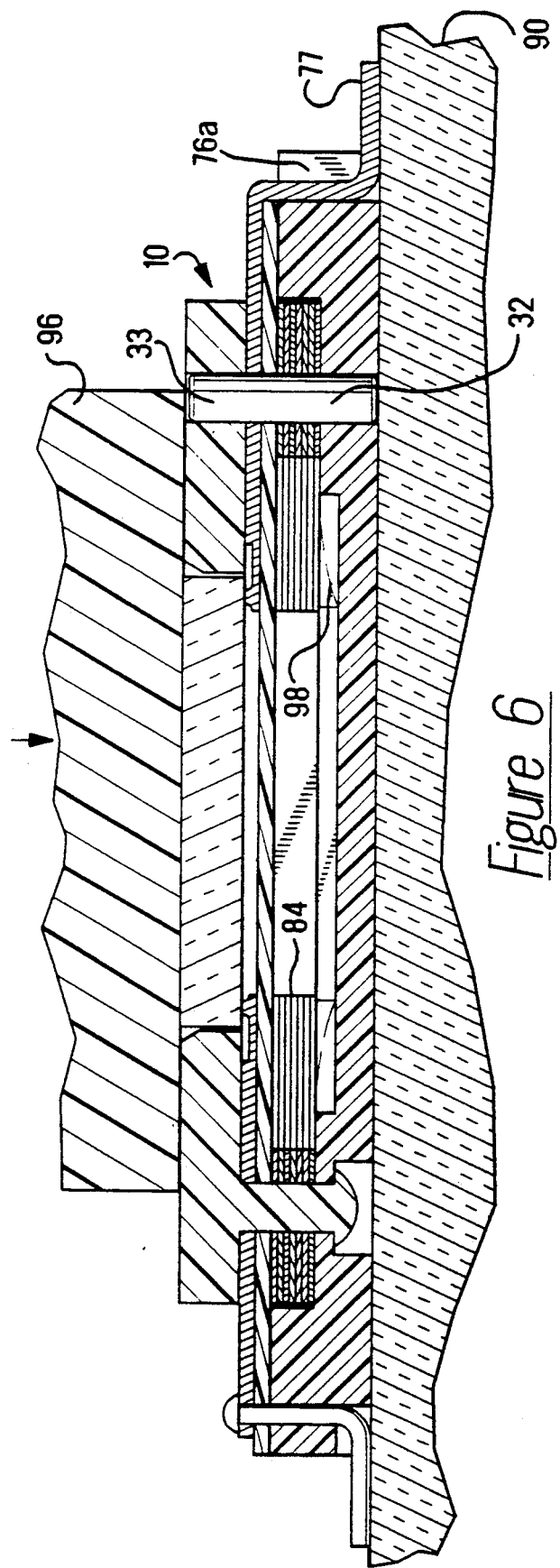
FIG. 6 is the sectioned view of FIG. 5 with a load imposed on the chip.

In the event elements 14 are to be soldered to circuit pads on substrate 90 as shown in FIG. 6, lower housing 20 requires side openings 92 to holes 76 so that the element shafts 36 which have been bent, can extend outwardly therethrough.

Gullwing leads 77, if provided on circuit member 16, extend down slots 76a and onto the circuit pads as shown in FIG. 5.

FIG. 5 also shows chip 22 in opening 24 in upper housing 12 with the bonding pads thereon engaging raised contact areas 70.

FIG. 6 shows socket 10 on substrate 90 with load 96 bearing down on chip 22 to produce the required normal force between contact areas 70 and the bonding pads. As the force exceeds a given level, spring fingers 84 bend down into second cavity 46 as indicated by dashed lines 98 thus storing energy. The floor of second cavity 46 prevents the fingers 84 from being overstressed. As spring fingers are being moved downwardly, raised contact areas 70 are wiping across the bonding pads to clean dirt and other debris and thereby enhance the electrical path therebetween.

Whereas socket 10 can be made as large as required, the principal advantage is that it can be made for chips having bonding pads on very close center lines; e.g. four mill centers. This is possible because spring finger 84 can be produced having a width of just two mills. Thus a very high, uniform force can be provided in a very limited space.

As can be discerned from the foregoing, an electrical socket having the capability of testing bare integrated circuit chips having bonding pads on extremely close centers and requiring a high normal contact force has been described. The socket includes a two piece housing, a film-circuit member and a support member having discrete spring fingers for each inner end on the circuit member. The support member is comprised of a number of thin, spring temper metal sheets stacked up to provide the support and stored energy for the required normal force.

We claim:

1. An electrical socket for electrically interconnecting an electronic device to a substrate, comprising:
    a housing having a cavity;
    a support plate of spring tempered metal having a central opening and spring fingers projecting into said opening, said plate positioned on said housing with said finger extending over said cavity;
    a film-circuit member having circuits thereon with said circuits having inner ends overlying respective said spring fingers and having contact areas thereon for electrically engaging contact areas on an electronic device, said circuits further having outer ends for being electrically attached to circuits on a substrate.

2. The socket of claim 1 wherein said support plate comprises a plurality of thin spring tempered metal sheets stacked on top of each other.

3. The socket of claim 1 further including connecting means connecting said outer ends to circuits on a substrate.

4. The socket of claim 1 wherein said contact areas are raised above the level of the inner ends.

5. The socket of claim 4 wherein said raised contact areas are formed by electroforming.

6. The socket of claim 4 wherein said raised contact areas are formed by wire bonding.

7. The socket of claim 6 wherein said wire bonding is followed by laser fusing.

8. The socket of claim 1 further including an upper housing over said film-circuit member and having an opening for receiving an electronic device.

9. The socket of claim 8 wherein said upper housing includes means for aligning said film-circuit member with said support plate.

10. The socket of claim 1 wherein said housing includes a first cavity for receiving the support plate and a second cavity over which said spring fingers extend.

11. The socket of claim 1 wherein said housing is of a ceramic material.

12. The socket of claim 1 wherein said housing is of a metal material.

13. The socket of claim 1 wherein said housing includes a first cavity for receiving the support plate and an opening over which said spring fingers extend.

14. An electrical socket for electrically connecting leadless electronic devices to a substrate, comprising:
    a lower housing having a first cavity in one surface and a smaller second cavity in a floor of said first cavity;
    a support plate having a central opening and a plurality of spring fingers projecting into said opening, said plate being positioned in said first cavity with said spring fingers overlying said second cavity;
    a film-circuit member having conductive-circuit with inner ends arranged in a given pattern and outer ends around the periphery, said circuit member positioned on said one surface with said inner ends in registration with respective said spring fingers and said outer ends adjacent sides of said lower housing;
    an upper housing having a central opening and positioned on said film-circuit member with said inner ends exposed in said opening for electrically engaging conductive pads on an electronic device which may be positioned in said opening; and
    connecting means for electrically connecting said outer ends of said circuits to a substrate on which said socket may be mounted.

15. The socket of claim 14 wherein said support plate comprises a plurality of stacked, thin spring temper metal sheets.

16. The socket of claim 14 wherein said upper housing further includes alignment pegs and said film-circuit member, support plate and lower housing have alignment holes for receiving said pegs.

17. The socket of claim 14 wherein said connecting means include contact elements having a shaft and said outer ends and lower housing having holes through which said shafts extend.

18. The socket of claim 17 wherein said shaft includes a bent free end for being soldered to circuits on a substrate.

19. The socket of claim 17 wherein said outer ends include a conductive pad and said contact elements include means thereon for being mechanically and electrically fixed to said pads.

20. The socket of claim 14 wherein said inner ends of said film-circuit member includes raised contact areas thereon.

21. The socket of claim 14 further including securing means for securing said lower housing, support plate, film-circuit member and upper housing together.

22. The socket of claim 21 wherein said securing means include pegs extending outwardly from one surface of said upper housing and said lower housing, support plate and film-circuit member have holes for receiving said pegs.

23. The socket of claim 22 wherein said holes in said lower housing include a shoulder and said pegs are upset against said shoulders.

24. The socket of claim 1 wherein said contact areas on said inner ends are raised.

25. The socket of claim 24 wherein said raised contact areas are plated with a noble metal.

26. The socket of claim 24 wherein said raised contact areas are formed from a noble metal.

27. The socket of claim 24 wherein said raised contact areas are formed from gold.

* * * * *